(12) United States Patent
Lin et al.

(10) Patent No.: US 12,211,739 B2
(45) Date of Patent: *Jan. 28, 2025

(54) METHOD FOR MANUFACTURING SEMICONDUCTOR DEVICE COMPRISING CONTACT VOID SURROUNDING BIT LINE

(71) Applicant: NANYA TECHNOLOGY CORPORATION, New Taipei (TW)

(72) Inventors: Li-Han Lin, Taoyuan (TW); Jr-Chiuan Wang, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 399 days.

This patent is subject to a terminal disclaimer.

(21) Appl. No.: 17/741,619

(22) Filed: May 11, 2022

(65) Prior Publication Data

US 2023/0369105 A1 Nov. 16, 2023

(51) Int. Cl.
*H01L 21/768* (2006.01)

(52) U.S. Cl.
CPC .. *H01L 21/76826* (2013.01); *H01L 21/76831* (2013.01); *H01L 21/76832* (2013.01)

(58) Field of Classification Search
None
See application file for complete search history.

(56) References Cited

U.S. PATENT DOCUMENTS

| | | | |
|---|---|---|---|
| 2011/0204427 A1 | 8/2011 | Choi et al. | |
| 2018/0240705 A1* | 8/2018 | Chang | H01L 21/76224 |
| 2020/0168613 A1* | 5/2020 | Chen | H01L 21/311 |
| 2021/0280718 A1 | 9/2021 | Matsubayashi et al. | |
| 2023/0369104 A1* | 11/2023 | Lin | H01L 21/76831 |
| 2023/0395387 A1* | 12/2023 | Lin | H01L 21/76832 |
| 2023/0395388 A1* | 12/2023 | Lin | H01L 21/31111 |

FOREIGN PATENT DOCUMENTS

| | | |
|---|---|---|
| TW | 459367 B | 10/2001 |
| TW | 200426942 A | 12/2004 |
| TW | 201123279 A | 7/2011 |
| TW | I351735 B | 11/2011 |
| TW | I479549 B | 4/2015 |
| TW | 201901896 A | 1/2019 |
| TW | 202201491 A | 1/2022 |
| TW | 202213555 A | 4/2022 |

* cited by examiner

*Primary Examiner* — Nduka E Ojeh
(74) *Attorney, Agent, or Firm* — MUNCY, GEISSLER, OLDS & LOWE, P.C.

(57) ABSTRACT

A method for manufacturing a semiconductor device includes: forming an isolation member defining an active region in a substrate; forming a first insulating layer having a bit line contact over the substrate; forming a second insulating layer having a bit line opening on the first insulating layer; forming a bit line structure in the bit line opening, the bit line structure being electrically connecting to the bit line contact, and a contact void being formed surrounding the bit line structure and exposing a portion of the bit line contact; conformally forming a nitride spacer layer over the bit line structure, the second insulating layer, and the conductive contact; conformally forming a plasma oxide layer over the nitride spacer layer; and performing a wet cleaning process by using an aqueous solution containing negatively charged ions.

15 Claims, 19 Drawing Sheets

METHOD FOR MANUFACTURING SEMICONDUCTOR DEVICE COMPRISING CONTACT VOID SURROUNDING BIT LINE

TECHNICAL FIELD

The present disclosure relates to a method for manufacturing a semiconductor structure, and more particularly, to a method for manufacturing a semiconductor structure for avoiding or reducing particle-induced defects.

DISCUSSION OF THE BACKGROUND

Semiconductor devices are widely used in electronics industries. Semiconductor devices may have relatively small sizes, multi-functional characteristics, and/or relatively low manufacture costs. The development of semiconductor device technology progresses continuously and the designs in the semiconductor devices of the new generation become smaller and more complicated than those of the former generation. The amount and the density of the components are increased constantly according to the requirements of innovated products, and the size of each device has to become smaller accordingly. As the size of the device becomes smaller, influence of defects induced by impurities generated during the manufacturing methods may become more serious, and the manufacturing yield may be affected accordingly.

This Discussion of the Background section is provided for background information only. The statements in this Discussion of the Background are not an admission that the subject matter disclosed in this section constitutes prior art with respect to the present disclosure, and no part of this Discussion of the Background may be used as an admission that any part of this application constitutes prior art with respect to the present disclosure.

SUMMARY

One aspect of the present disclosure provides a method for manufacturing a semiconductor structure, comprising forming a first insulating layer over a substrate; forming a conductive contact in the first insulating layer; forming a second insulating layer having an opening on the first insulating layer, the opening exposing atop surface of the conductive contact; forming a conductive line structure in the opening of the second insulating layer, the conductive line structure covering a portion of the exposed top surface of the conductive contact thereby forming a contact void between the second insulating layer and the conductive line structure; forming a plasma oxide layer to cover exposed surfaces of the conductive line structure, the second insulating layer, and the conductive contact; performing a wet cleaning process by using an aqueous solution containing negatively charged ions; forming a capping layer over the plasma oxide layer, the capping layer filling the contact void; and performing an etching back process to remove the capping layer above the contact void.

Another aspect of the present disclosure provides a method for manufacturing a semiconductor device, comprising forming an isolation member defining an active region in a substrate; forming a first insulating layer having a bit line contact over the substrate; forming a second insulating layer having a bit line opening on the first insulating layer; forming a bit line structure in the bit line opening, the bit line structure being electrically connected to the bit line contact, and a contact void being formed surrounding the bit line structure and exposing a portion of the bit line contact; conformally forming a nitride spacer layer over the bit line structure, the second insulating layer, and the conductive contact; conformally forming a plasma oxide layer over the nitride spacer layer; and performing a wet cleaning process by using an aqueous solution containing negatively charged ions. The method for manufacturing the semiconductor device further comprises forming a capping layer over the plasma oxide layer, the capping layer filling the contact void; and performing an etching back process to remove the capping layer above the contact void.

In some embodiments, the negatively charged ions are selected from the group consisting of carbonate ions, bicarbonate ions, and combinations thereof.

In some embodiments, the aqueous solution containing negatively charged ions are selected from the group consisting of deionized water dissolved with carbon dioxide, deionized water dissolved with sodium carbonate, deionized water dissolved with sodium bicarbonate, and combinations thereof.

In some embodiments, the etching back process is performed by using a wet etchant comprising phosphorus acid.

In some embodiments, the etching back process is performed by using a wet etchant comprising phosphorus acid and silicic acid.

In some embodiments, the method of forming a second insulating layer having an opening on the first insulating layer comprises forming a second insulating layer on the first insulating layer; and forming an opening in the second insulating layer to expose a top surface of the conductive contact, wherein a width of the opening is greater than a width of the top surface of the conductive contact.

In some embodiments, a top surface of the conductive contact is fully exposed by the opening.

In some embodiments, the contact void formed in the opening surrounds the conductive line structure.

In some embodiments, prior to forming the plasma oxide layer, the method further comprises conformally depositing a nitride spacer layer over the substrate.

In some embodiments, the plasma oxide layer is conformally disposed on the nitride spacer layer.

In some embodiments, prior to performing the wet cleaning process, the plasma oxide layer comprises a plurality of positively charged ions on the surface thereof.

In some embodiments, after performing the wet cleaning process, the plasma oxide layer is free of positively charged ions on the surface thereof.

In some embodiments, the etching back process is performed by using the plasma oxide layer as an etch stop layer.

In some embodiments, after performing the etching back process to remove the capping layer above the contact void, the plasma oxide layer is free of crystalline silicate particles on the surface thereof.

In the manufacturing methods of the semiconductor structure or semiconductor device, a wet cleaning process using an aqueous solution containing negatively charged ions is performed after the formation of the plasma oxide layer. The wet cleaning process not only can remove chemical and particle impurities, but also positively charged ions generated during the formation of the plasma oxide layer. Otherwise, the positively charged ions formed during the formation of the plasma oxide layer will combine with negatively charged ions generated at the subsequent etching back process to form undesired crystals or particles. By using the wet cleaning process prior to the etching back process, defects induced by the undesired crystals or particles can be avoided or reduced, and the manufacturing yield may be increased accordingly. Therefore, the device performance can be enhanced.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
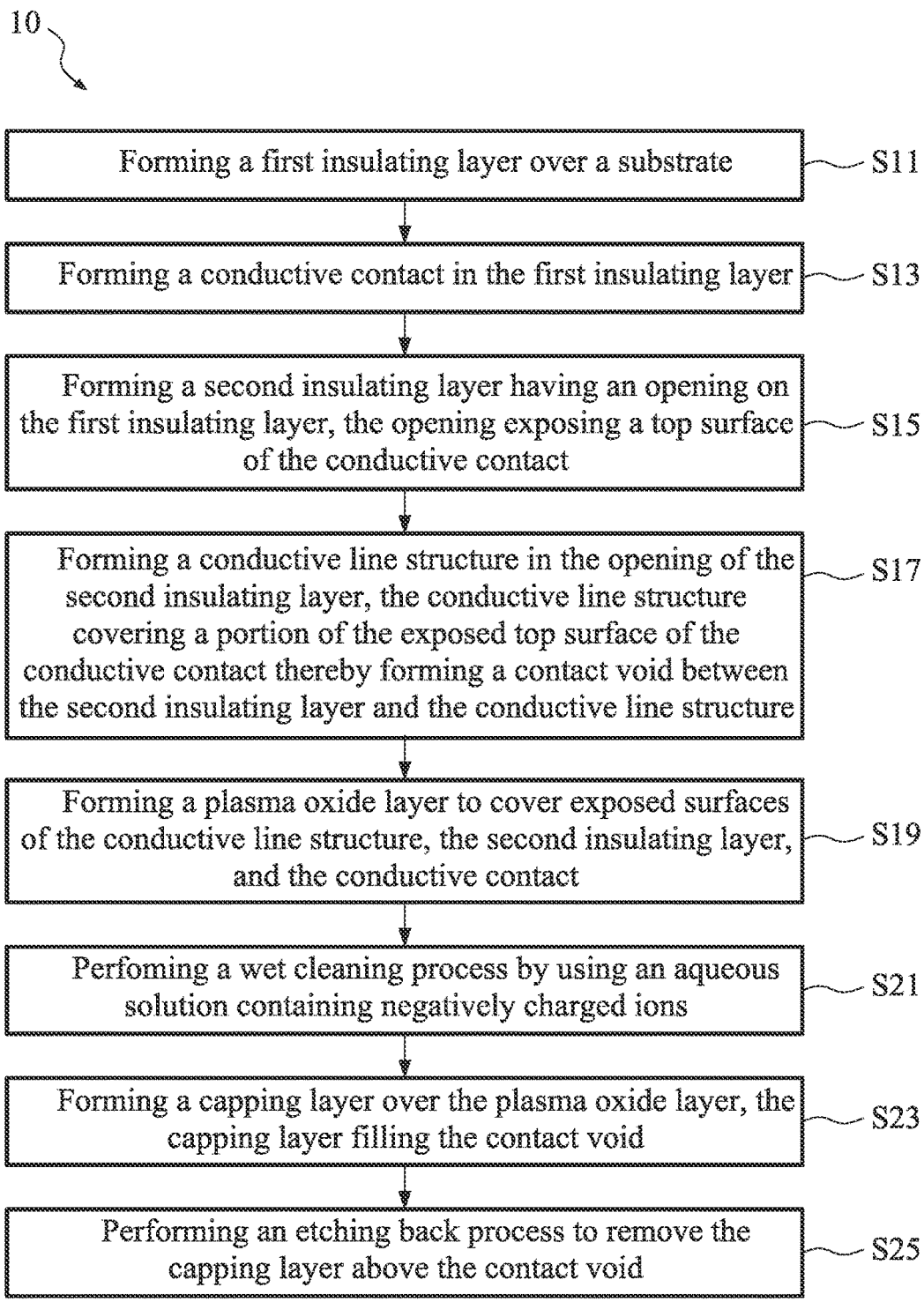
FIG. 1 is a flow diagram illustrating a method for manufacturing a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that the terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It will be understood that when an element is referred to as being formed "on" or "over" another element, it can be directly or indirectly, formed on the given element by growth, deposition, etch, attach, connect, or couple.

It will be understood that, although the terms "first," "second," etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially flat," or "substantially vertical," may be exactly the same, equal, or planar, or may be the same, equal, or planar within acceptable variations that may occur, for example, due to manufacturing processes.

FIG. 1 is flow diagram illustrating a method 10 for manufacturing a semiconductor structure in accordance with some embodiments of the present disclosure. The method 10 can avoid or significantly reduce particle-induced defects. The method 10 may be performed as operations. It may be noted that the method 10 may include the same, more, or fewer operations. It may be noted that the method 10 may be performed by one or more pieces of semiconductor fabrication equipment or fabrication tools. In some embodiments, the method 10 includes operations (steps) S11, S13, S15, S17, S19, S21, S23, and S25. The steps S11 to S25 of FIG. 1 are elaborated in connection with following figures.

Figure 2:
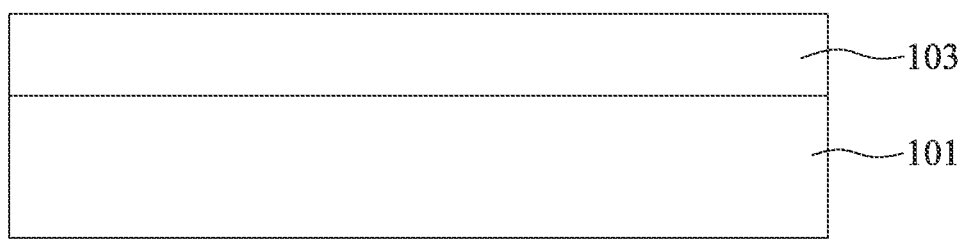
FIG. 2 to FIG. 9 are schematic cross-sectional views illustrating one or more stages of a method for manufacturing a semiconductor structure in accordance with some embodiments of the present disclosure.

FIGS. 2 to 9 are schematic cross-sectional views illustrating one or more stages of a method for manufacturing a semiconductor structure in accordance with some embodiments of the present disclosure. With reference to FIGS. 1 and 2, at step S11, a substrate 101 is provided, and a first insulating layer 103 is formed over the substrate 101. The substrate 101 may be formed of a semiconductor material, for example, silicon, doped silicon, silicon germanium, silicon on insulator, silicon on sapphire, or silicon carbide, but is not limited thereto. The first insulating layer 103 may be formed of silicon nitride, silicon oxide, silicon oxynitride, or a combination thereof but is not limited thereto.

Figure 3:
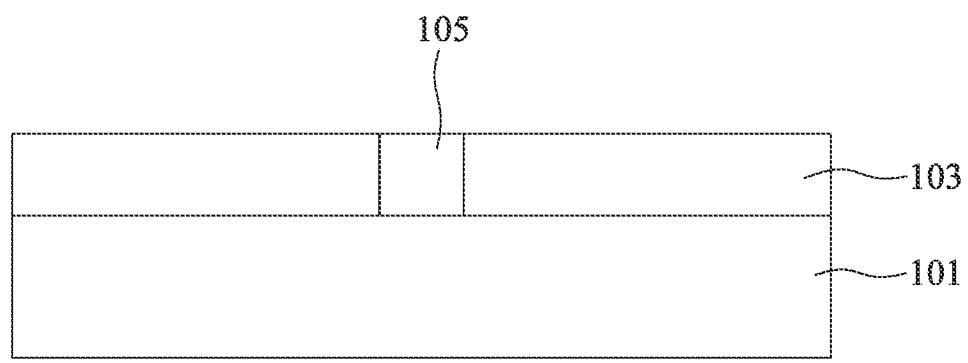

With reference to FIGS. 1 and 3, at step S13, a conductive contact 105 is formed in the first insulating layer 103. A plurality of conductive contacts (not shown) may be formed, but only one conductive contact 105 is shown in FIG. 3. Referring to FIG. 3, the method may be performed by using a photolithography process to pattern the first insulating layer 103 to define the position of the conductive contact 105. An etch process, such as an anisotropic dry etch process, may be performed after the photolithography process to form a contact hole (not shown) in the first insulating layer 103. After the etch process, a conductive material layer (not shown), for example, aluminum, copper, tungsten, cobalt, or other suitable metal or metal alloy is deposited, by a deposition process such as chemical vapor deposition, physical vapor deposition, sputtering, or the like, in the contact hole for forming the conductive contact 105. A planarization process, such as chemical mechanical polishing, may be performed after the deposition process to remove excess deposited material and provide a substantially flat surface for subsequent processing steps.

Figure 4:
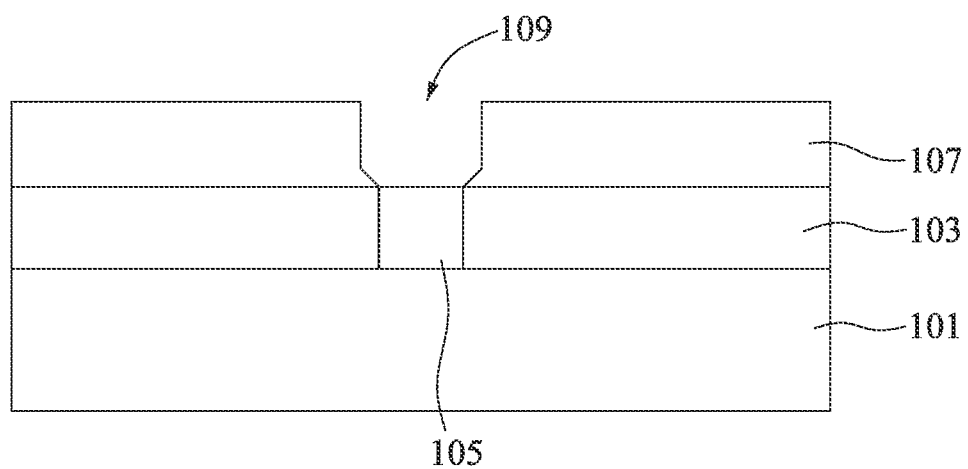

With reference to FIGS. 1 and 4, at step S15, a second insulating layer 107 having an opening 109 is formed over the first insulating layer 103, so that a top surface of the conductive contact 105 is exposed through the opening 109. A plurality of openings (not shown) may be formed over a corresponding conductive contact, but only one opening 109 is shown in FIG. 4. Referring to FIG. 4, the method is performed by forming a second insulating layer 107 on the first insulating layer 103. The second insulating layer 107 may be formed of the same material as the material of the first insulating layer 103, but is not limited thereto. A photolithography process may be used to pattern the second insulating layer 107 to define the position of the opening 109. An etch process, such as an anisotropic dry etch process, may be performed after the photolithography process to form the opening 109 in the second insulating layer 107. The opening 109 may be referred to as a bit line opening. The opening 109 has a width broader than or substantially the same as the conductive contact 105, so that a top surface of the conductive contact 105 is fully exposed by the opening 109. In some embodiments, a smallest width of the opening 109 is greater than a width of the top surface of the conductive contact 105. The opening 109 is broader enough to facilitate forming a conductive line structure therein at the subsequent step. The opening 109 may have a cross-sectional shape, such as a rectangular, a square, a wide upper and narrower lower shape, but is not limited thereto. The opening 109 may also have a hole-like or well-like shape. The opening 109 may have an inclined sidewall, a substantially vertical sidewall, but is not limited thereto.

Figure 5:
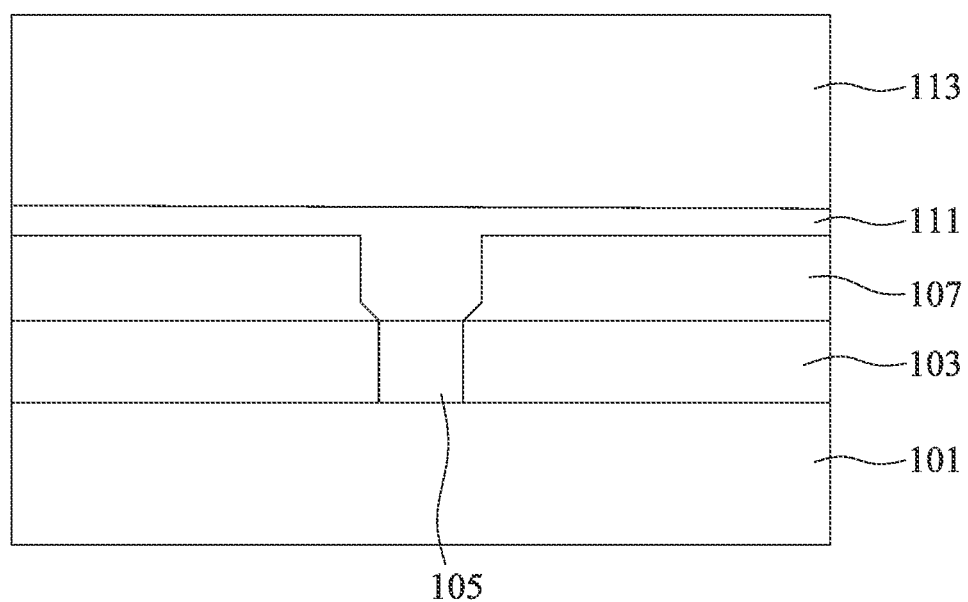
Figure 6:
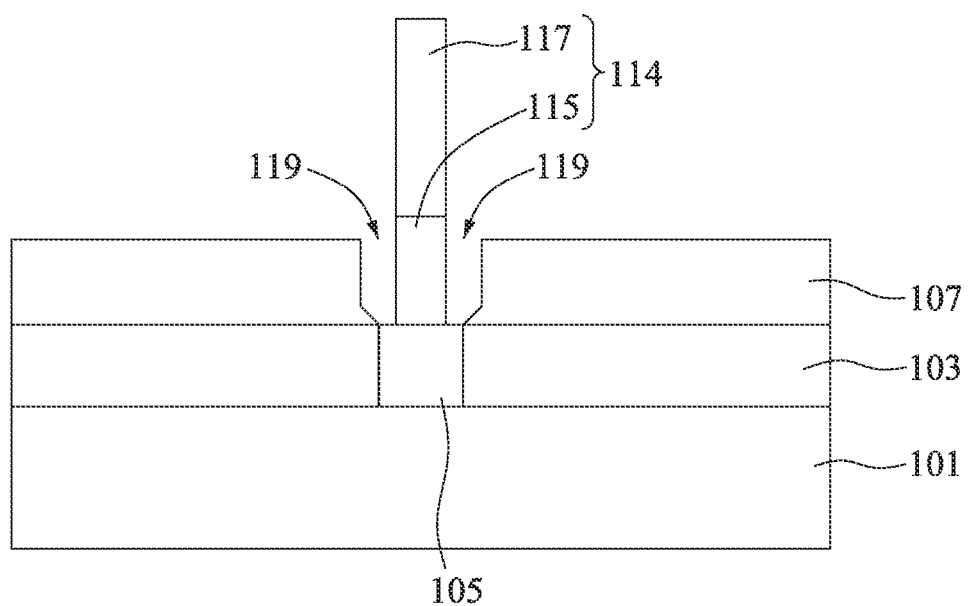

With reference to FIGS. 1, 5 and 6, at step S17, a conductive line structure 114 is formed in the opening 109 of the second insulating layer 107, wherein the conductive line structure 114 covers a portion of the top surface of the conductive contact 105 thereby forming a contact void 119 between the second insulating layer 107 and the conductive line structure 114. The conductive line structure 114 may be a single layer or a stack. The conductive line structure 114 comprising two conductive material layers is shown in FIGS. 5 and 6. Referring to FIG. 5, the method may be performed to form a lower conductive material layer 111 in the opening 109 and on the second insulating layer 107 through a deposition process, and forming an upper conductive material layer 113 on the lower conductive material layer 111. The lower conductive material layer 111 may be a single layer including doped polysilicon, a metal, a metal silicide or a metal compound, or it may be a multi-layer including any combination of the above materials, but is not limited thereto. The upper conductive material layer 113 may include a metal or a metal compound, but is not limited thereto. A barrier layer (not shown) may be formed between the lower conductive material layer 111 and the upper conductive material layer 113. The barrier layer contains titanium nitride or titanium tungsten nitride, but is not limited thereto.

Referring to FIG. 6, the method may be performed to form a conductive line structure 114 having a lower conductive line structure 115 and an upper conductive line structure 117 by successively patterning the upper conductive material layer 113 and the lower conductive material layer 111 through an etch process. An etch process is performed by using a patterned mask layer (not shown) as a mask to pattern the upper conductive material layer 113 and the lower conductive material layer 11. Thus, the two patterned conductive material layer together form the conductive line structure 114. The lower conductive line structure 115 and the upper conductive line structure 117 may have a line shape extending horizontally in a one-dimensional way, or a plug-like or pillar-like shape. The conductive line structure 114 has a width narrower than the conductive contact 105, so that a portion of the top surface of the conductive contact 105 is exposed. After forming the conductive line structure 114, a contact void 119 is formed between the second insulating layer 107 and the conductive line structure 114 and surrounding the conductive line structure 114. The top surface of the conductive contact 105 is also partially exposed through the contact void 119. To avoid the contact void 119 from affecting the electricity or properties of the semiconductor structure, the contact void 119 has to be refilled at the subsequent steps.

Figure 7:
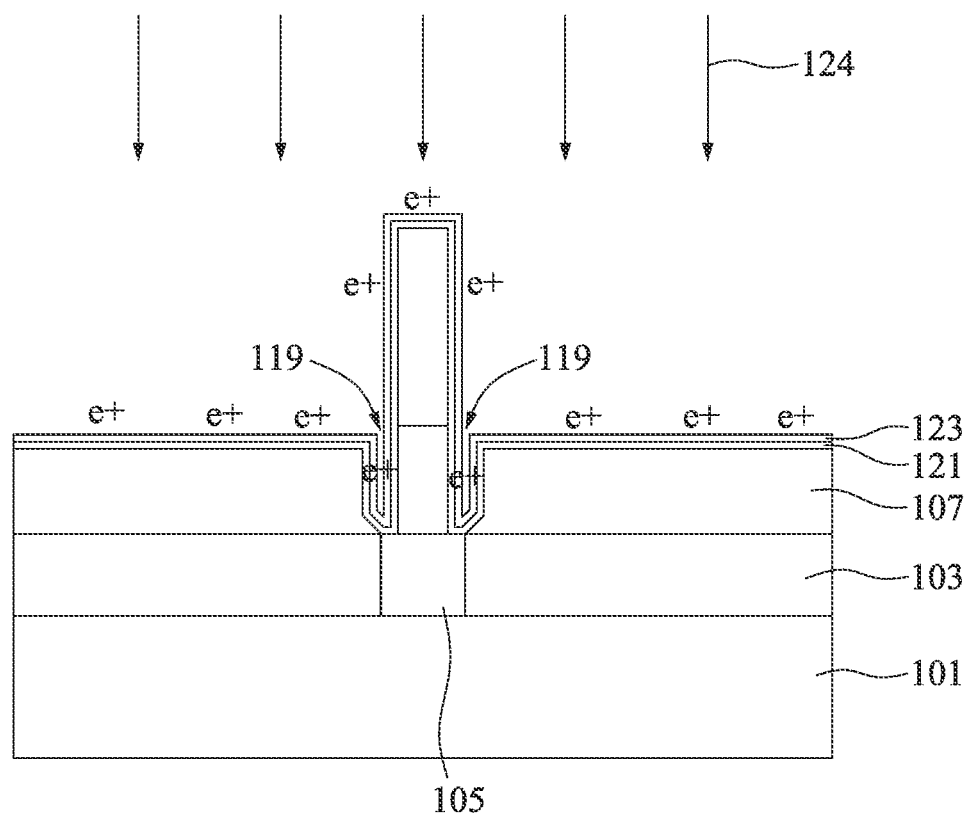

With reference to FIGS. 1 and 7, at steps S19 and S21, a plasma oxide layer 123 is formed to cover exposed surfaces of the conductive line structure 114, the second insulating layer 107, and the conductive contact 105. Prior to forming the plasma oxide layer 123, a nitride spacer layer 121 may be conformally deposited over the substrate 101, and the plasma oxide layer 123 is then conformally disposed on the nitride spacer layer 121. The nitride spacer layer 121 may be formed on the sidewalls of the conductive line structure 114. The nitride spacer layer 121 may be formed of silicon nitride. The plasma oxide layer 123 may comprise silicon oxide, silicone dioxide, silicon oxyfluoride, or silicon oxynitride, but is not limited thereto. The plasma oxide layer 123 may be formed by plasma enhanced chemical vapor deposition, high density plasma chemical vapor deposition, or thermal plasma chemical vapor deposition, but is not limited thereto.

During the formation of the plasma oxide layer 123, a plurality of positively charged ions $e^+$ may be induced to the surface of the plasma oxide layer 123. The positively charged ions $e^+$ may be positively charged functional groups, positively charged residues, positively charged free radicals, or the like. The positively charged ions $e^+$ generated during the formation of the plasma oxide layer 123 will combine with negatively charged ions, such as those generated at the subsequent etching back process to form undesired crystals or particles. In order to avoid the undesired crystals or particles subsequently formed, the positively charged ions $e^+$ have to be neutralized by negatively charged ions. To achieve the purpose, a wet cleaning process 124 by using an aqueous solution containing negatively charged ions is performed after the formation of the plasma oxide layer 123. Suitable negatively charged ions are selected from the group consisting of carbonate ions, bicarbonate ions, and combinations thereof. The aqueous solution containing negatively charged ions are selected from the group consisting of deionized water dissolved with carbon dioxide, deionized water dissolved with sodium carbonate, deionized water dissolved with sodium bicarbonate, and combinations thereof. The amount or concentration of the negatively charged ions in the aqueous solution is sufficient to neutralize the positively charged ions on the surface of the plasma oxide layer 123. After performing the wet cleaning process, the amount of the positively charged ions or other impurities on the plasma oxide layer 123 can be significantly reduced, or the plasma oxide layer 123 is substantially free or free of positively charged ions on the surface thereof.

Figure 8:
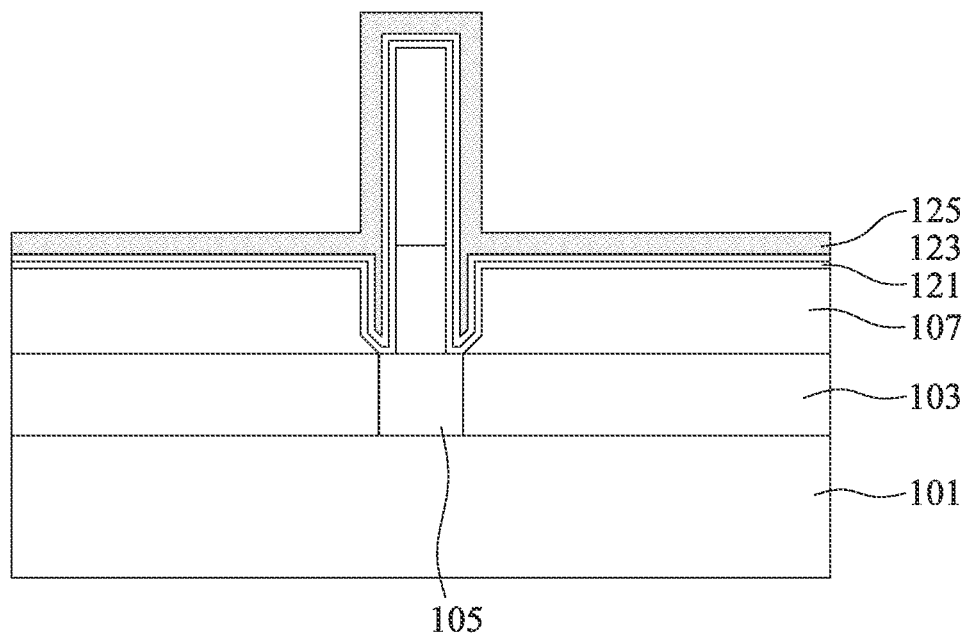

With reference to FIGS. 1 and 8, at step S23, a capping layer 125 is formed on the plasma oxide layer 123, and the capping layer fills into the contact void 119. The capping layer 125 is formed in the contact void 119 and on the plasma oxide layer 123. The capping layer 125 is thick enough so that the contact void 119 is fully refilled. The capping layer 125 may be formed of silicon nitride, or the like.

Figure 9:
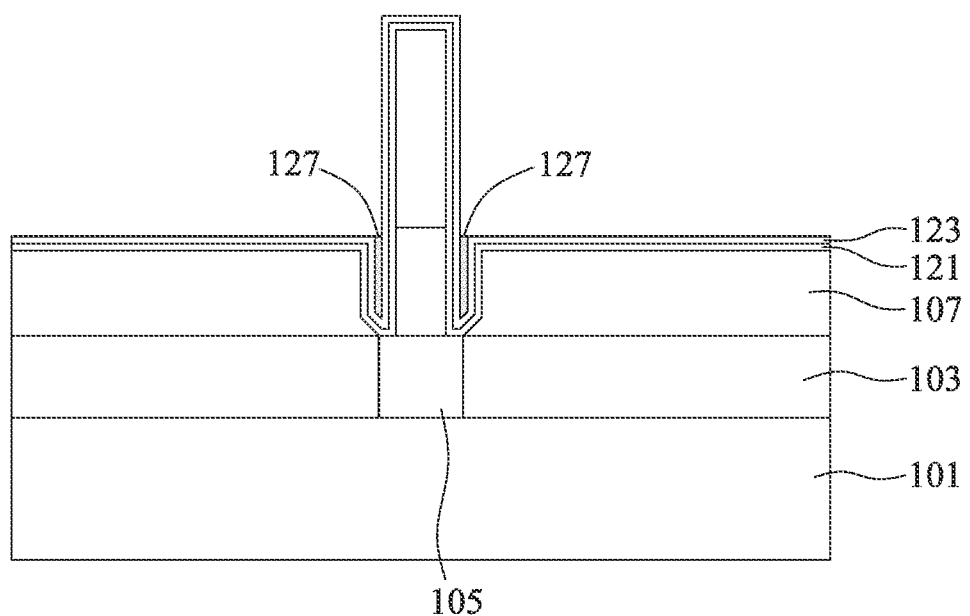

With reference to FIGS. 1 and 9, at step S25, an etching back process is performed to remove the capping layer 125 above the contact void 119. The etching back process is performed to remove the capping layer 125 until the plasma oxide layer 123 is exposed and a refilled contact void 127 is formed. The plasma oxide layer 123 is used as an etch stop layer. The surface of the refilled contact void 127 is a substantially flat surface. The etching back process is performed by using a wet etchant comprising phosphorus acid. The etching back process is an isotropic removal process performed with hot phosphoric acid etching in an immersion bath at a temperature of about exceeding about 160° C., such as about 165° C. Dry (plasma) etching cannot be used since achievable selectivities are much lower. Prior to the etching back process, a pre-wet cleaning may be performed. During the wet etching back process, the selectivity of the capping layer 125 to the plasma oxide layer 123 may change during the course of an etching back process, so a source of silicate ions, $HSiO_3^-$, is preferably added to the phosphorus acid bath to help assure very high selectivity of nitride to oxide. In order to increase the selectivity of nitride to oxide, the concentration of the silicate source may be increased in the phosphorus acid bath, which can also avoid the loss of the oxide. It has been found that the oxide etching rate is determined by the concentration of silicic acid, and that the concentration of silicic acid has essentially no effect on the nitride etching rate. By preloading the bath with silicic acid, the nitride-to-oxide selectivity is very good. The silicate source may be a liquid such as tetraethoxysilane (TEOS). Silicic acid may dissolve in hot phosphoric acid to produce the silicate ions.

However, the increased amount of the silicate source may increase the chance of the formation of undesired crystals or particles. The amount of the undesired crystals or particles is dependent on the concentration of the silicate ions in the hot phosphorus acid bath. Thus, after etching in the hot phosphorus acid, the negatively charged silicate ions may bond to positively charged ions to form electrically neutral materials, i.e., undesired crystalline silicate particles, on the surface of the semiconductor structure. The undesired crystalline silicate particles may cause defects and affect the electricity or other properties of the semiconductor structure. In order to avoid the situation, referring to FIG. 7, the wet cleaning process 124 has to be performed after the formation of the plasma oxide layer 123 to remove the positively charged ions. Referring back to FIG. 9, after performing the etching back process, the exposed plasma oxide layer 123 is substantially free of or free of crystalline silicate particles on the surface thereof. By using the wet cleaning process prior to the etching back process, defects can be avoided from generating at the subsequent procedure, and the surface of the exposed plasma oxide layer 123 will not be damaged. Since defects induced by the undesired crystals or particles can be effectively avoided or reduced, the manufacturing yield may be increased accordingly.

Figure 10:
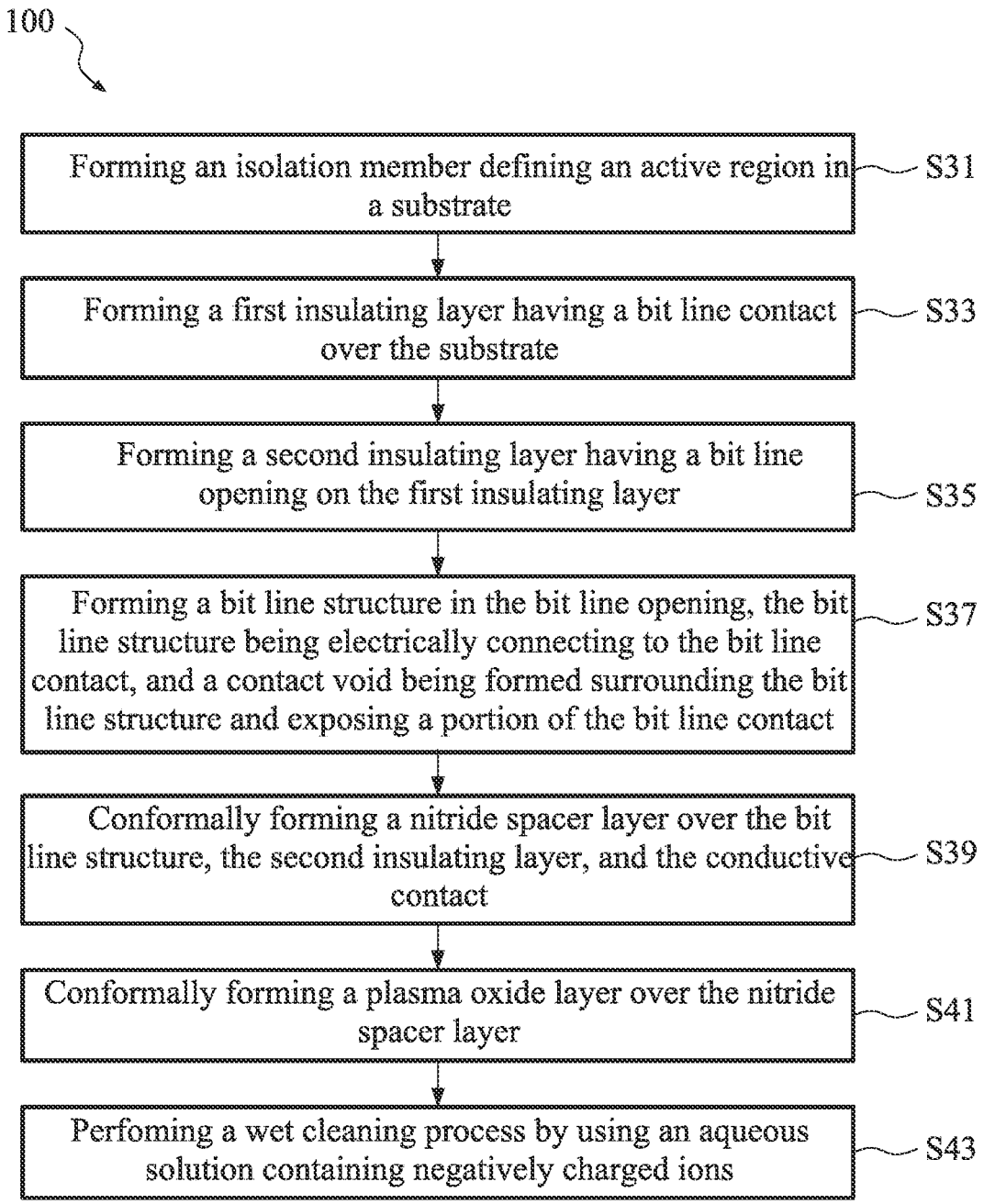
FIG. 10 is a flow diagram illustrating a method for manufacturing a semiconductor device in accordance with some embodiments of the present disclosure.

FIG. 10 is flow diagram illustrating a method 100 for manufacturing a semiconductor device in accordance with some embodiments of the present disclosure. The method 100 can avoid or significantly reduce particle-induced defects. The method 100 may be performed as operations. It may be noted that the method 100 may include the same, more, or fewer operations. It may be noted that the method 100 may be performed by one or more pieces of semiconductor fabrication equipment or fabrication tools. In some embodiments, the method 100 includes operations (steps) S31, S33, S35, S37, S39, S41, and S43. The steps S31 to S43 of FIG. 10 are elaborated in connection with following figures.

Figure 11:
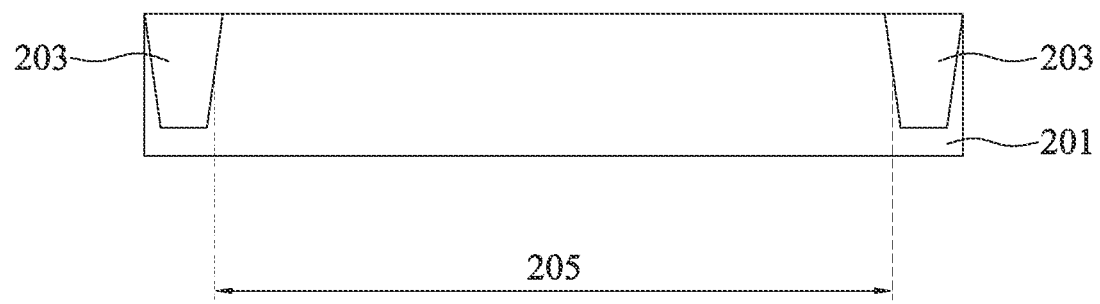
FIG. 11 to FIG. 19 are schematic cross-sectional views illustrating one or more stages of a method for manufacturing a semiconductor device in accordance with some embodiments of the present disclosure.

FIGS. 11 to 19 are schematic cross-sectional views illustrating one or more stages of a method for manufacturing a semiconductor device in accordance with some embodiments of the present disclosure. In some embodiments, some of FIGS. 11 to 19 correspond to FIGS. 2 to 9, and in this figures, similar descriptions regarding the same components or elements are omitted. With reference to FIGS. 10 and 11, at step S31, an isolation member 203 defining an active region 205 is formed in a substrate 201. While two isolation members 203 and one active region 205 are illustrated in the figures, it will be appreciated that the substrate 201 may include any suitable number of isolation members 203 and active regions 205. The other components or elements may include any suitable number in the semiconductor device. The plurality of isolation members 203 are separated from each other in a cross-sectional view and define a plurality of active regions 205. The forming of the isolation members 203 may be implemented by performing a shallow trench isolation (STI) process. The plurality of isolation members 203 may be formed of, for example, an insulating material such as silicon oxide, silicon nitride, silicon oxynitride, silicon nitride oxide, or fluoride-doped silicate, but is not limited thereto.

Figure 12:
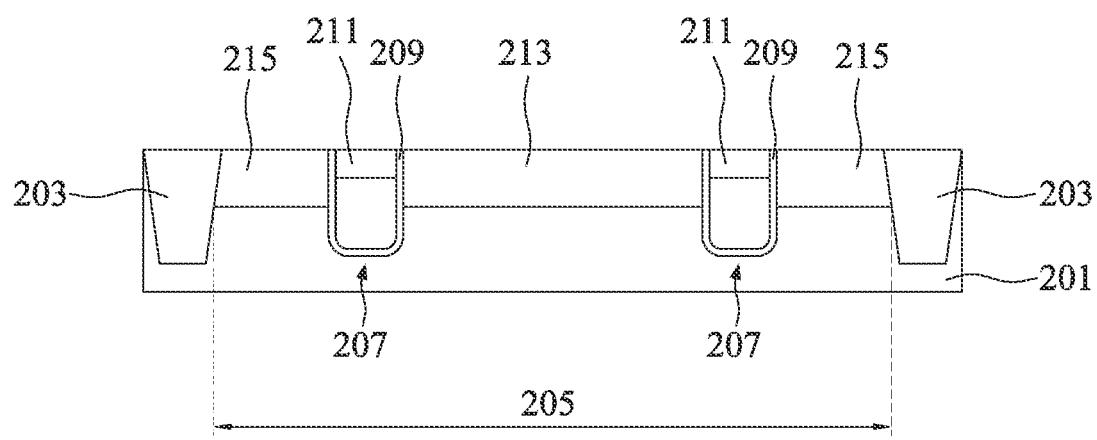

With reference to FIGS. 10 and 12, a word line 207 may be formed in the substrate 201. While two word lines 207 are illustrated in the figures, it will be appreciated that the substrate 201 may include any suitable number of word lines 207. In some embodiments, each one of the plurality of word lines 207 may include a bottom layer 209 and a top layer 211. The bottom layers 209 may be formed of, for example, silicon oxide, silicon oxynitride, silicon nitride oxide, or silicon nitride, but is not limited thereto. The top layer 211 may be formed of for example, doped polysilicon, metal material, metal silicide, but is not limited thereto. Then, a plurality of doped regions may be formed in the active regions 205 of the substrate 201. The plurality of the doped regions may include a first doped region 213 and a second doped regions 215. The first doped region 213 is disposed between two adjacent word lines 207. The second doped regions 215 are respectively disposed between the plurality of isolation members 203 and the plurality of word lines 207. The first doped region 213 and the second doped regions 215 are respectively doped with a dopant such as phosphorus, arsenic, or antimony.

Figure 13:
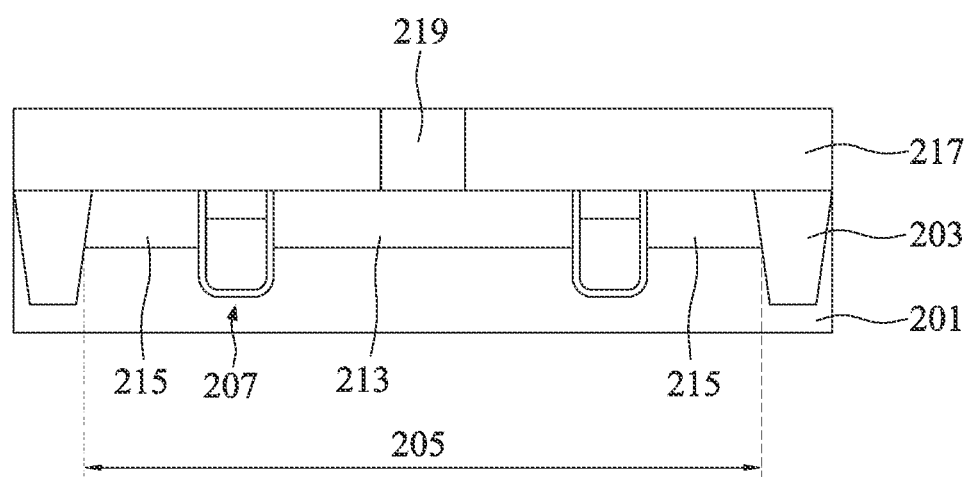

With reference to FIGS. 10 and 13, at step S33, a first insulating layer 217 is formed over the substrate 201, and a bit line contact 219 is formed in the first insulating layer 103. The bit line contact 219 is disposed over the first active region 213 of the substrate 201. The bit line contact 219 is disposed on the first doped region 213 and is electrically connected to the first doped region 213.

Figure 14:
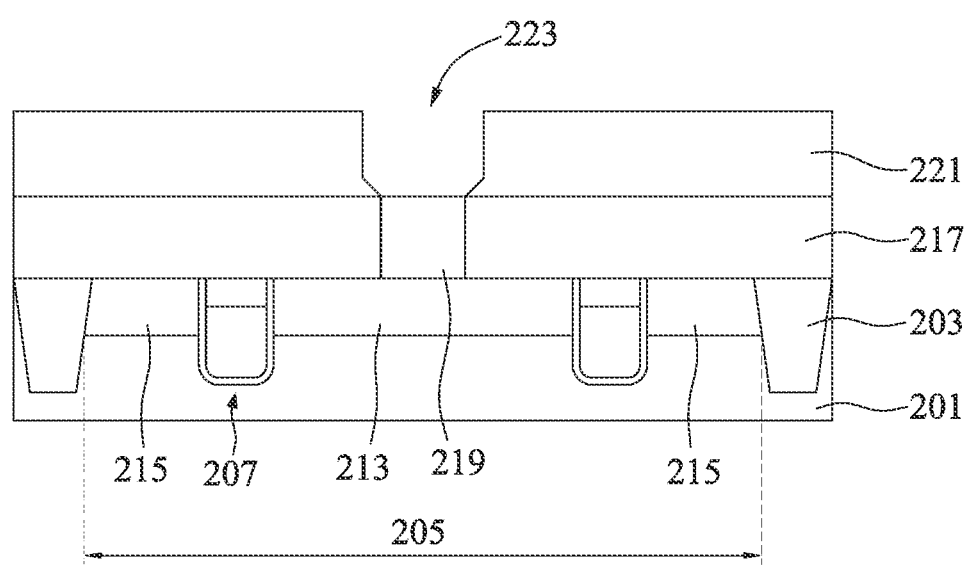

With reference to FIGS. 10 and 14, at step S35, a second insulating layer 221 having a bit line opening 223 is formed over the first insulating layer 217, so that a top surface of the bit line contact 219 is exposed through the bit line opening 223. Referring to FIG. 14, the method is performed by forming a second insulating layer 221 on the first insulating layer 217. A photolithography process may be used to pattern the second insulating layer 221 to define the position of the bit line opening 223. An etch process, such as an anisotropic dry etch process, may be performed after the photolithography process to form the bit line opening 223 in the second insulating layer 221. The bit line opening 223 may be referred to as a bit line opening. The bit line opening 223 has a width broader than or substantially the same as the conductive contact, so that a top surface of the bit line contact 219 is fully exposed by the bit line opening 223. In some embodiments, a smallest width of the bit line opening 223 is greater than a width of the top surface of the bit line contact 219. The bit line opening 223 is broader enough to facilitate forming a conductive line structure therein at the subsequent step. The bit line opening 223 may have a cross-sectional shape, such as a rectangular, a square, a wide upper and narrower lower shape, but is not limited thereto. A width of the bottom surface of the bit line opening 223 is substantially to or greater than a width of the top surface of the bit line contact 219. The bit line opening 223 may also have a hole-like or well-like shape. The bit line opening 223 may have an inclined sidewall, a substantially vertical sidewall, but is not limited thereto.

Figure 15:
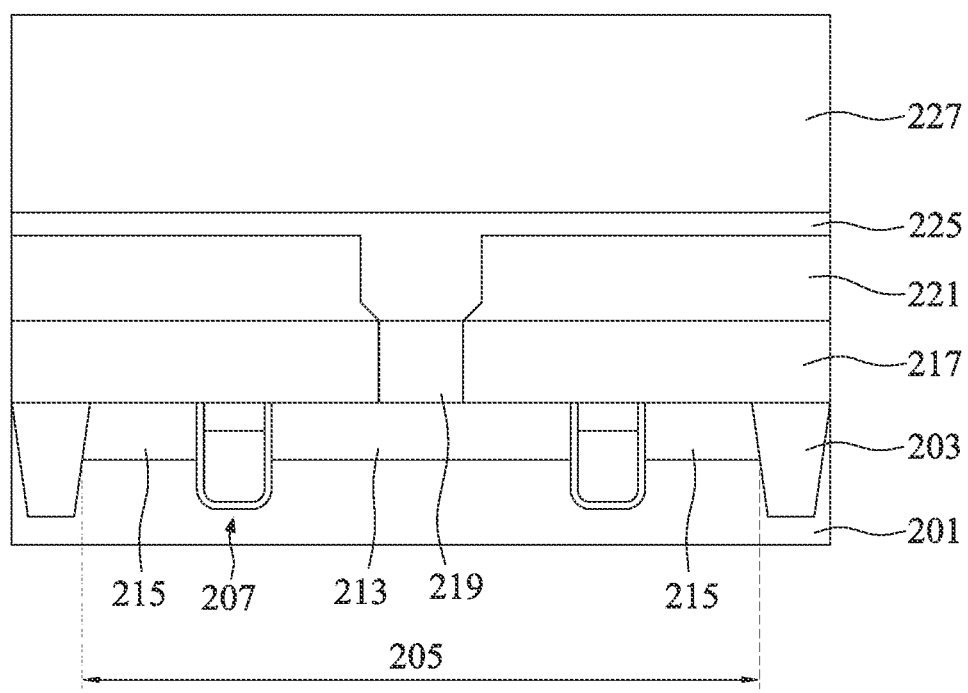
Figure 16:
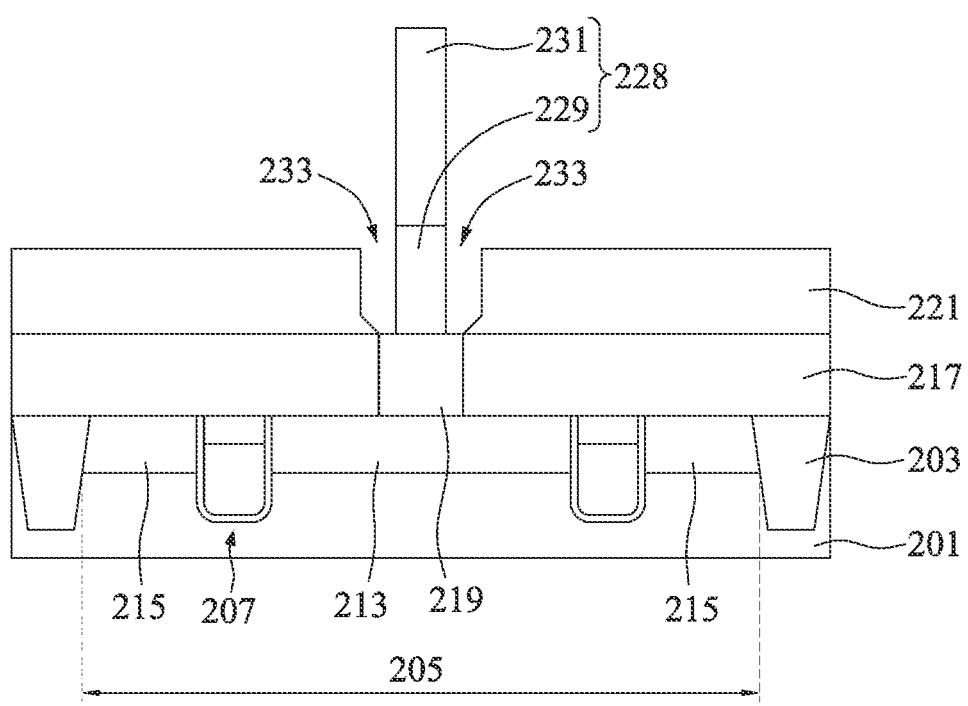

With reference to FIGS. 10, 15 and 16, at step S37, a bit line structure 228 is formed in the bit line opening 223 of the second insulating layer 221, wherein the bit line structure 228 covers a portion of the top surface of the bit line contact 219 thereby forming a contact void 233 between the second insulating layer 221 and the bit line structure 228. The bit line structure 228 may be a single layer or a stack. The bit line structure 228 comprising two conductive material layers is shown in FIGS. 15 and 16. Referring to FIG. 15, the method may be performed to form a lower conductive material layer 225 in the bit line opening 223 and on the second insulating layer 221 through a deposition process, and forming an upper conductive material layer 227 on the lower conductive material layer 225. The lower conductive material layer 225 may be a single layer including doped polysilicon, a metal, a metal silicide or a metal compound, or it may be a multi-layer including any combination of the above materials, but is not limited thereto. The upper conductive material layer 227 may include a metal or a metal compound, but is not limited thereto. A barrier layer (not shown) may be formed between the lower conductive material layer 225 and the upper conductive material layer 227. The barrier layer contains titanium nitride or titanium tungsten nitride, but is not limited thereto.

Referring to FIG. 16, the method may be performed to form a bit line structure 228 having a lower bit line structure 229 and an upper bit line structure 231 by successively patterning the upper conductive material layer 227 and the lower conductive material layer 225 through an etch process. An etch process is performed by using a patterned mask layer (not shown) as a mask to pattern the upper conductive material layer 227 and the lower conductive material layer 225. Thus, the two patterned conductive material layer together form the bit line structure 228. The lower bit line structure 229 and the upper bit line structure 231 may have a line shape extending horizontally in a one-dimensional way, or a plug-like or pillar-like shape. The bit line structure 228 may have a width narrower than the bit line contact 219, so that a portion of the top surface of the bit line contact 219 is exposed. After forming the bit line structure 228, a contact void 233 is formed between the second insulating layer 221 and the bit line structure 228 and surrounding the bit line structure 228. The top surface of the bit line contact 219 is also partially exposed through the contact void 233. To avoid the contact void 233 from affecting the electricity or properties of the semiconductor structure, the contact void 233 has to be refilled at the subsequent steps.

Figure 17:
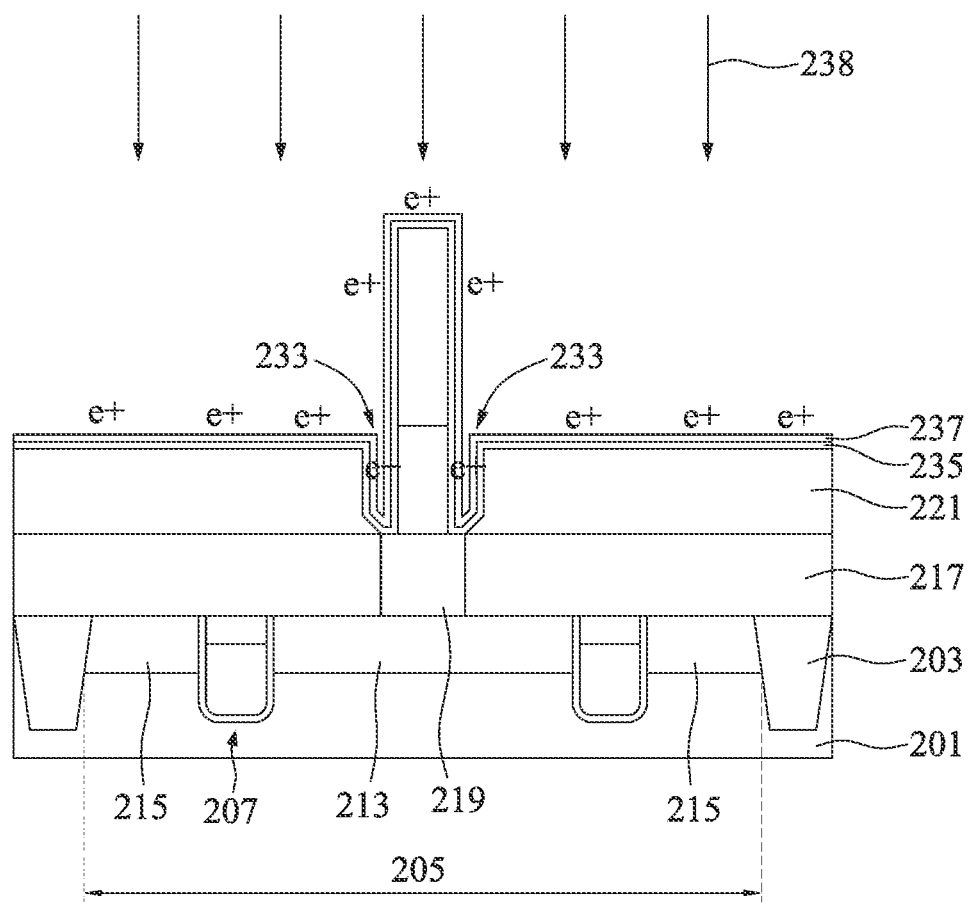

With reference to FIGS. 10 and 17, at steps S39 and S41, a nitride spacer layer 235 is conformally formed over the bit line structure 228, the second insulating layer 221, and the bit line contact 219, and a plasma oxide layer 237 is then conformally formed over the nitride spacer layer 235. The nitride spacer layer 235 may be formed on the sidewalls of the bit line structure 228. The nitride spacer layer 235 may be formed of silicon nitride. The plasma oxide layer 237 may comprise silicon oxide, silicone dioxide, silicon oxyfluoride, or silicon oxynitride, but is not limited thereto. The plasma oxide layer 237 may be formed by plasma enhanced chemical vapor deposition, high density plasma chemical vapor deposition, or thermal plasma chemical vapor deposition, but is not limited thereto.

During the formation of the plasma oxide layer 237, a plurality of positively charged ions $e^+$ may be induced to the surface of the plasma oxide layer 123. The positively charged ions $e^+$ may be positively charged functional groups, positively charged residues, positively charged free radicals, or the like. The positively charged ions $e^+$ generated during the formation of the plasma oxide layer 237 will combine with negatively charged ions, such as those generated at the subsequent etching back process to form undesired crystals or particles. In order to avoid the undesired crystals or particles subsequently formed, the positively charged ions $e^+$ have to be neutralized by negatively charged ions. To achieve the purpose, a wet cleaning process 238 by using an aqueous solution containing negatively charged ions is performed after the formation of the plasma oxide layer 237. Suitable negatively charged ions are selected from the group consisting of carbonate ions, bicarbonate ions, and combinations thereof. The aqueous solution containing negatively charged ions are selected from the group consisting of deionized water dissolved with carbon dioxide, deionized water dissolved with sodium carbonate, deionized water dissolved with sodium bicarbonate, and combinations thereof. The amount or concentration of the negatively charged ions in the aqueous solution is sufficient to neutralize the positively charged ions on the surface of the plasma oxide layer 237. After performing the wet cleaning process, the amount of the positively charged ions or other impurities on the plasma oxide layer 237 can be significantly reduced, or the plasma oxide layer 237 is substantially free or free of positively charged ions on the surface thereof.

Figure 18:
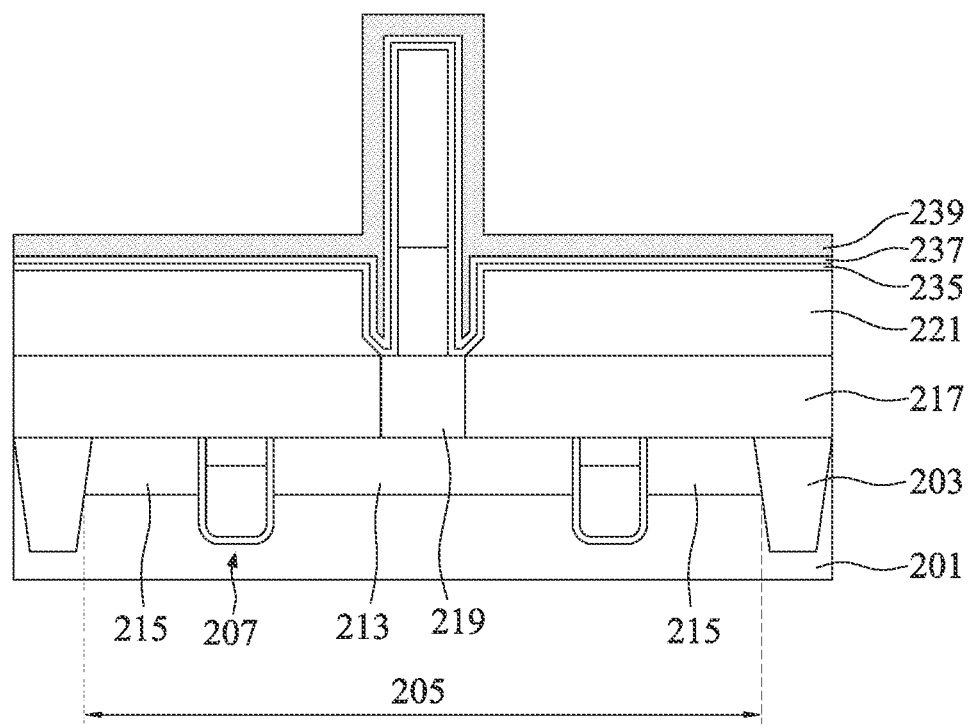

With reference to FIGS. 17 and 18, the method further comprises forming a capping layer 239 over the plasma oxide layer 237, and the capping layer fills into the contact void 233. The capping layer 239 is formed in the contact void 233 and on the plasma oxide layer 237. The capping layer 239 is thick enough so that the contact void 233 is fully refilled. The capping layer 239 may be formed of silicon nitride, or the like.

Figure 19:
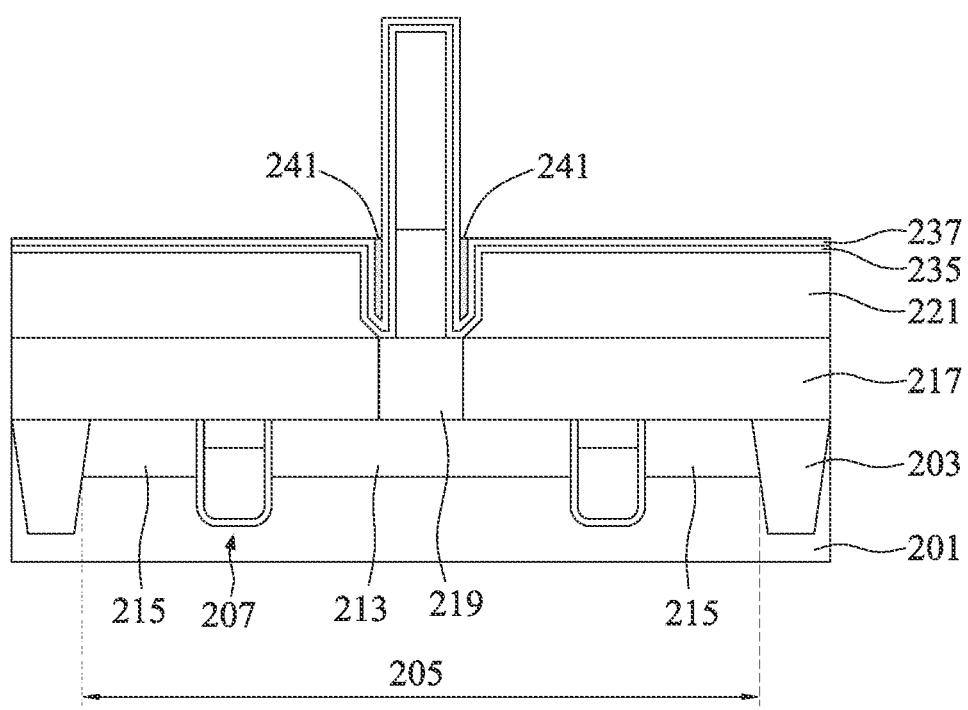

With reference to FIG. 19, the method further comprises performing an etching back process to remove the capping layer 239 above the contact void 233. The etching back process is performed to remove the capping layer 239 until the plasma oxide layer 237 is exposed and a refilled contact void 241 is formed. The plasma oxide layer 237 is used as an etch stop layer. The surface of the refilled contact void 241 is a substantially flat surface. The etching back process is performed by using a wet etchant comprising phosphorus acid. The etching back process is an isotropic removal process performed with hot phosphoric acid etching in an immersion bath at a temperature of about exceeding about 160° C., such as about 165° C. Prior to the etching back process, a pre-wet cleaning may be performed. During the wet etching back process, the selectivity of the capping layer 239 to the plasma oxide layer 237 may change during the course of an etching back process, so a source of silicate ions, $HSiO_3^-$, is preferably added to the phosphorus acid bath to help assure very high selectivity of nitride to oxide. Since the wet cleaning process 238 shown in FIG. 17 has removed the positively charged ions $e^+$ generated during the formation of the plasma oxide layer 237, undesired crystalline silicate particles will not be formed at the etching back process. Referring to FIG. 19, after performing the etching back process, the exposed plasma oxide layer 237 is substantially free of or free of crystalline silicate particles on the surface thereof. By using the wet cleaning process prior to the etching back process, defects can be avoided from generating at the subsequent procedure, and the surface of the exposed plasma oxide layer 237 will not be damaged. Since defects induced by the undesired crystals or particles can be effectively avoided or reduced, the manufacturing yield may be increased accordingly.

In the manufacturing methods of the semiconductor structure or semiconductor device, a wet cleaning process using an aqueous solution containing negatively charged ions is performed after the formation of the plasma oxide layer. The wet cleaning process not only can remove chemical and particle impurities, but also positively charged ions generated during the formation of the plasma oxide layer. Therefore, the positively charged ions formed during the formation of the plasma oxide layer will not exist at the subsequent procedure, and undesired crystals or particles will not be generated by combining the positively charged ions with negatively charged ions at the subsequent etching back process. By using the wet cleaning process prior to the etching back process, defects induced by the undesired crystals or particles can be avoided or reduced, and the manufacturing yield may be increased accordingly.

In comparison with conventional the manufacturing process of the present disclosure overcomes avoiding or reducing particle-induced defects. Therefore, the device performance can be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for manufacturing a semiconductor device, comprising:
   forming an isolation member defining an active region in a substrate;
   forming a first insulating layer having a bit line contact over the substrate;
   forming a second insulating layer having a bit line opening on the first insulating layer;
   forming a bit line structure in the bit line opening, the bit line structure being electrically connecting to the bit line contact, and a contact void being formed surrounding the bit line structure and exposing a portion of the bit line contact;
   conformally forming a nitride spacer layer over the bit line structure, the second insulating layer, and the bit line contact;
   conformally forming a plasma oxide layer over the nitride spacer layer; and
   performing a wet cleaning process on the plasma oxide layer by using an aqueous solution containing negatively charged ions.

2. The method of claim 1, wherein the negatively charged ions are selected from the group consisting of carbonate ions, bicarbonate ions, and combinations thereof.

3. The method of claim 1, wherein the aqueous solution containing negatively charged ions are selected from the group consisting of deionized water dissolved with carbon dioxide, deionized water dissolved with sodium carbonate, deionized water dissolved with sodium bicarbonate, and combinations thereof.

4. The method of claim 1, further comprises:
   forming a capping layer over the plasma oxide layer, the capping layer filling the contact void; and
   performing an etching back process to remove the capping layer above the contact void.

5. The method of claim 4, wherein the etching back process is performed by using a wet etchant comprising phosphorus acid.

6. The method of claim 5, wherein the phosphorus acid comprises silicate ions.

7. The method of claim 1, wherein a smallest width of the bit line opening in the second insulating layer is greater than a width of the top surface of the bit line contact.

8. The method of claim 1, wherein a top surface of the bit line contact is fully exposed by the bit line opening.

9. The method of claim 1, wherein a width of the bottom surface of the bit line opening is substantially equal to or greater than a width of the top surface of the bit line contact.

10. The method of claim 1, wherein forming a bit line structure in the bit line opening of the second insulating layer comprises:
    forming a first conductive material layer on the second insulating layer, the first conductive material layer filling the bit line opening;
    forming a second conductive material layer on the first conductive material layer; and
    performing an etching process to pattern the first conductive material layer and the second conductive material layer, so as to form the bit line structure comprising the patterned conductive material layers.

11. The method of claim 1, further comprises forming a capping layer over the plasma oxide layer, the capping layer filling the contact void; and performing an etching back process to remove the capping layer above the contact void.

12. The method of claim 11, wherein the etching back process is performed by using the plasma oxide layer as an etch stop layer.

13. The method of claim 12, wherein after performing the etching back process to remove the capping layer above the contact void, the plasma oxide layer is free of crystalline silicate particles on the surface thereof.

14. The method of claim 1, wherein prior to performing the wet cleaning process, the plasma oxide layer comprises a plurality of positively charged ions on the surface thereof.

15. The method of claim 1, wherein after performing the wet cleaning process, the plasma oxide layer is free of positively charged ions on the surface thereof.

* * * * *